United States Patent
Sayem et al.

(10) Patent No.: US 10,944,158 B2
(45) Date of Patent: Mar. 9, 2021

(54) WRIST-WORN ELECTRONIC DEVICE WITH A SIDE WALL LOOP ANTENNA

(71) Applicant: Garmin Switzerland GmbH, Schaffhausen (CH)

(72) Inventors: Abu T. Sayem, Overland Park, KS (US); Toby C. Wilcher, Lenexa, KS (US)

(73) Assignee: Garmin Switzerland GmbH

( * ) Notice: Subject to any disclaimer, the term of this patent is extended or adjusted under 35 U.S.C. 154(b) by 90 days.

(21) Appl. No.: 16/409,553

(22) Filed: May 10, 2019

(65) Prior Publication Data

US 2019/0379105 A1 Dec. 12, 2019

Related U.S. Application Data

(60) Provisional application No. 62/683,979, filed on Jun. 12, 2018.

(51) Int. Cl.
*H01Q 7/00* (2006.01)
*H01Q 1/24* (2006.01)
(Continued)

(52) U.S. Cl.
CPC .............. *H01Q 1/273* (2013.01); *H01Q 1/242* (2013.01); *H01Q 5/335* (2015.01); *H01Q 7/00* (2013.01);
(Continued)

(58) Field of Classification Search
CPC .......... H01Q 1/24; H01Q 1/242; H01Q 1/243; H01Q 1/273; H01Q 9/04; H01Q 9/0421;
(Continued)

(56) References Cited

U.S. PATENT DOCUMENTS

| 8,988,296 B2 | 3/2015 | Koskiniemi et al. |
| 9,509,054 B2 | 11/2016 | Koskiniemi et al. |

(Continued)

FOREIGN PATENT DOCUMENTS

| CN | 107706548 A | 2/2018 |
| KR | 1020180050151 A | 5/2018 |

OTHER PUBLICATIONS

PCT Patent Application PCT/US2019/036231 International Search Report and Written Opinion dated Oct. 14, 2019.

(Continued)

*Primary Examiner* — Thai Pham
(74) *Attorney, Agent, or Firm* — Samuel M. Korte; Max M. Ali

(57) ABSTRACT

A wrist-worn electronic device comprises a housing, a printed circuit board, a location determining element, a first electrically conductive element, a second electrically conductive element, and a first loop antenna. The housing includes a side wall formed at least in part from an electrically conductive material and including an isolation portion formed from non-conductive material extending from an upper edge of the side wall to a lower edge of the side wall. The printed circuit board retains a first and second signal terminals. The location determining element receives a first electronic signal from the first signal terminal. The first loop antenna is formed by the first electrically conductive element, the second electrically conductive element, a first portion of a perimeter of the side wall, and a first circumferential portion of the printed circuit board.

20 Claims, 7 Drawing Sheets

(51) Int. Cl.
  *H01Q 1/27* (2006.01)
  *H05K 5/00* (2006.01)
  *H05K 1/18* (2006.01)
  *H01Q 5/335* (2015.01)
  *H01Q 9/04* (2006.01)

(52) U.S. Cl.
  CPC ............. *H05K 1/18* (2013.01); *H05K 5/0086* (2013.01); *H01Q 9/04* (2013.01); *H05K 2201/10098* (2013.01)

(58) Field of Classification Search
  CPC .......... H01Q 9/0428; H01Q 7/00; H01Q 1/42; H01Q 5/328; H01Q 5/335; H01Q 5/50
  See application file for complete search history.

(56) References Cited

U.S. PATENT DOCUMENTS

| | | | | |
|---|---|---|---|---|
| 10,271,299 | B1* | 4/2019 | Sayem | H01Q 13/10 |
| 10,276,925 | B2* | 4/2019 | Han | G04G 21/025 |
| 2013/0169494 | A1* | 7/2013 | Hung | H01Q 21/24 |
| | | | | 343/756 |
| 2014/0225786 | A1* | 8/2014 | Lyons | G04G 21/04 |
| | | | | 343/702 |
| 2014/0266920 | A1* | 9/2014 | Tran | H01Q 7/00 |
| | | | | 343/702 |
| 2016/0099497 | A1* | 4/2016 | Lee | H01Q 1/273 |
| | | | | 343/702 |
| 2016/0344439 | A1 | 11/2016 | Seol et al. | |
| 2016/0352014 | A1* | 12/2016 | Chen | H01Q 5/328 |
| 2017/0040701 | A1 | 2/2017 | Hanabusa | |
| 2017/0214422 | A1* | 7/2017 | Na | H01Q 5/35 |
| 2019/0379122 | A1 | 12/2019 | Kenkel et al. | |

OTHER PUBLICATIONS

ElectronicsNotes, "Antenna RF Diplexer," https://www.electronics-notes.com/articles/antennas-propagation/antenna-diplexer/what-is-antenna-diplexer.php, printed Oct. 2, 2019, published before May 10, 2019.

Wikipedia, "Diplexer," https://en.wikipedia.org/wiki/Diplexer/, printed Oct. 2, 2019, published before May 10, 2019.

Microwaves101.com, "Diplexers," https://www.microwaves101.com/encyclopedias/diplexers/, printed Oct. 2, 2019, published before May 10, 2019.

PCT Patent Application PCT/US2019/036235 International Search Report and Written Opinion, dated Oct. 1, 2019.

* cited by examiner

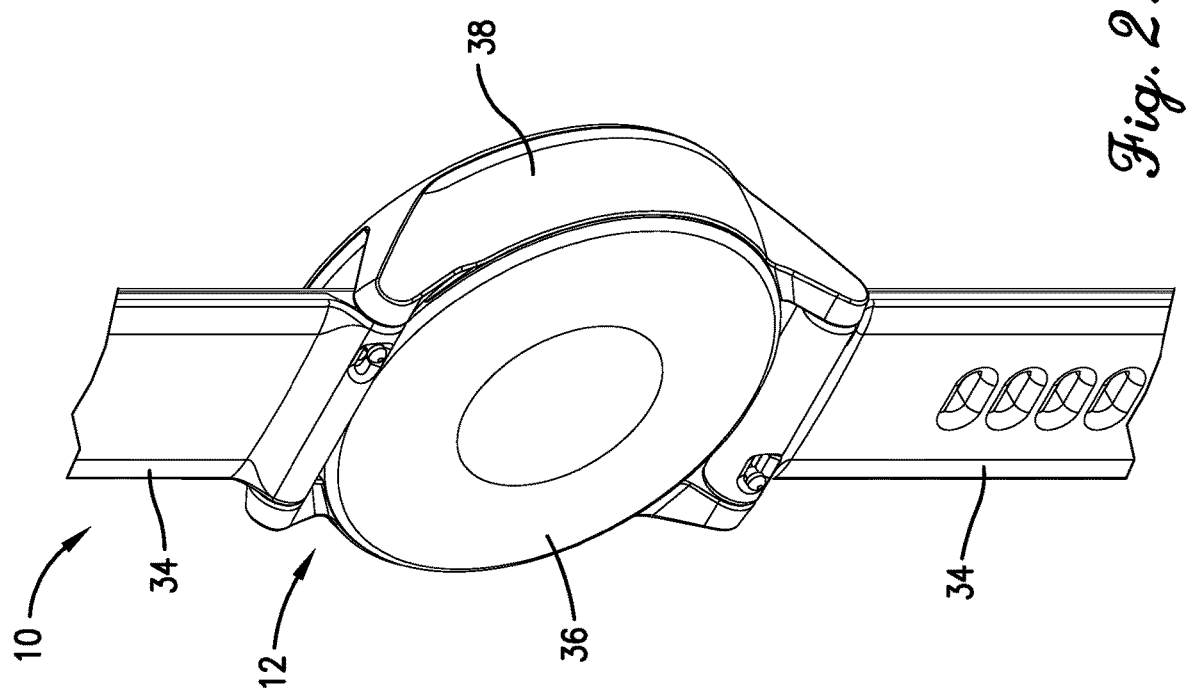
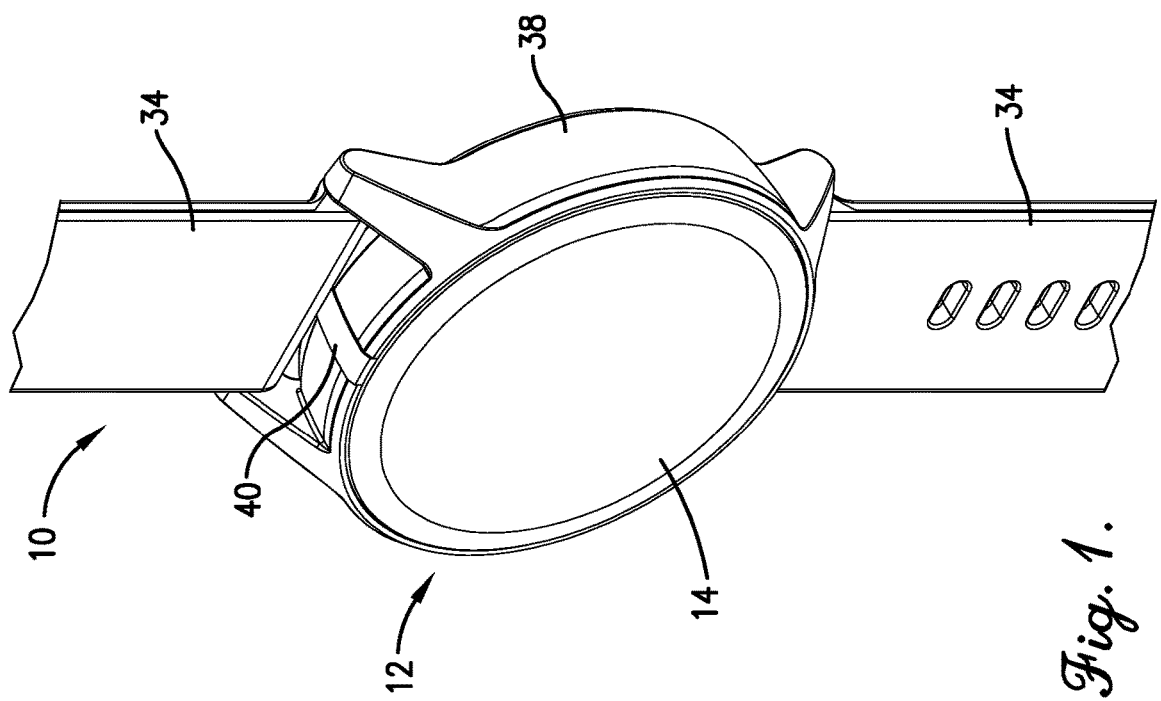

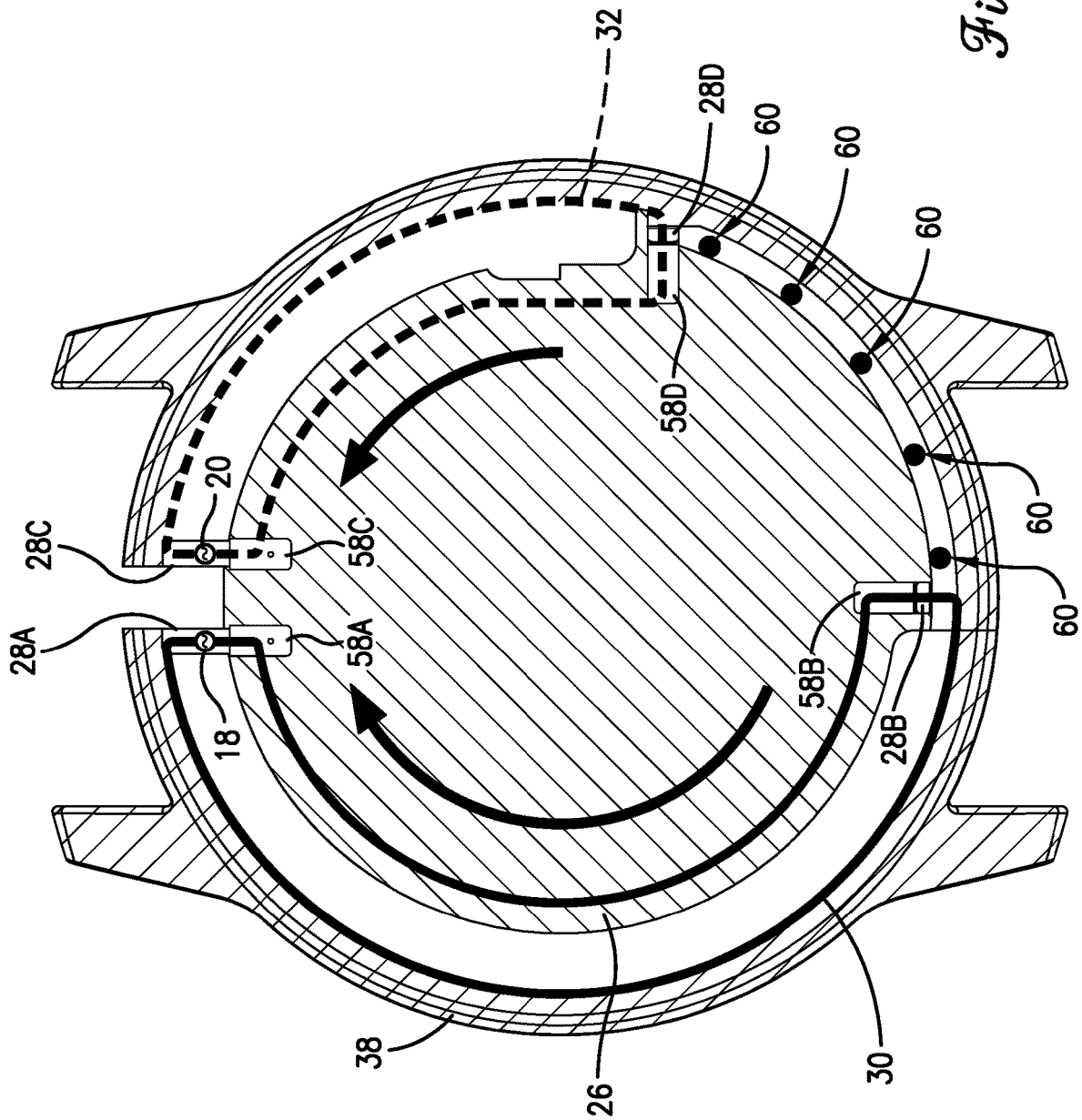

WRIST-WORN ELECTRONIC DEVICE WITH A SIDE WALL LOOP ANTENNA

RELATED APPLICATIONS

The present application claims the priority benefit under 35 U.S.C. § 119(e) of U.S. Provisional Application Ser. No. 62/683,979, filed Jun. 12, 2018, and entitled "Wrist-Worn Device with Loop Antenna," which is herein incorporated by reference in its entirety.

BACKGROUND

Wrist-worn electronic devices often include functionality that may be used to track wearers' current location, distances traveled, velocities, and other performance metrics or data. This functionality may be provided by receiving positional information from a satellite-based positioning system including the global navigation satellite system (GNSS). In addition, such devices may communicate wirelessly with other electronic devices, systems, or networks to monitor a user's activities, running or biking performance, upload and download data, receive messages and information, and so forth. The communication protocols utilized to transmit and receive information may include Bluetooth, Wi-Fi, or cellular signaling protocols. Such devices may also include one or more antennas that are utilized to receive signals from GNSS satellites and wirelessly communicate with other electronic devices.

Conventional wrist-worn electronic devices implement a variety of techniques to position one or more antennas that can send and receive the abovementioned signals. Due to the challenges of positioning an antenna near electrically conductive material, many conventional wrist-worn electronic devices utilize housings formed substantially of non-conductive material, such as plastic. Conventional wrist-worn electronic devices including a housing having side walls formed of conductive material typically position one or more antennas, which may be used to receive GNSS signals and/or transmit and receive communication signals, above the side walls. For example, some conventional wrist-worn electronic device housings include a carrier formed of non-conductive material positioned on or near an upper surface of metal side walls and the one or more antennas are positioned on the carrier to electrically isolate the antennas from the metal side walls. Alternatively, some conventional wrist-worn electronic device housings include a non-conductive isolating element that electrically isolates adjacent portion(s) of the housing. For example, co-pending application Ser. No. 15/863,311 discloses a watch housing including an electrically nonconductive ring positioned between side walls formed of electrically conductive material and a bezel formed of electrically conductive material such that a slot antenna is formed. It is generally understood that slot antennas are different from loop antennas. Similarly, some conventional wrist-worn electronic device housings include a non-conductive isolating element between a lower housing and one or more upper portions of the housing. For example, some conventional wrist-worn electronic device housings include two non-conductive isolating elements separating a wide (when viewed from the side) lower housing, which includes a bottom wall and side walls formed of an electrically conductive material, from two radiating elements, which are formed of an electrically conductive material positioned above portions of the lower housing and separated by a display. Additionally, some non-wrist worn conventional electronic devices, such as mobile phones, include one or more non-conductive isolating elements, which extend from an upper edge to a lower edge of a side wall, that electrically isolate adjacent side walls formed of electrically conductive material.

SUMMARY

Embodiments of the present technology provide a wrist-worn electronic device with an improved antenna configuration. The electronic device broadly comprises a housing, a printed circuit board, a location determining element, a first electrically conductive element, a second electrically conductive element, and a first loop antenna. The housing includes a bottom wall formed from electrically non-conductive material and configured to contact a wearer's wrist, and a side wall coupled to the bottom wall, with the side wall being formed at least in part from an electrically conductive material and including an isolation portion formed from non-conductive material extending from an upper edge of the side wall to a lower edge of the side wall. The printed circuit board is positioned within the housing and retains a first electrically conductive signal terminal positioned at a first contact location along the perimeter of the printed circuit board and a second electrically conductive signal terminal positioned at a second contact location along the perimeter of the printed circuit board. The location determining element is positioned on the printed circuit board and is electrically coupled with the first signal terminal. The location determining element is configured to receive a first electronic signal from the first signal terminal and determine a current geolocation of the electronic device based on the first electronic signal. The first electrically conductive element is electrically connected to the first signal terminal and a first location of the housing side wall corresponding to the first contact location. The second electrically conductive element is electrically connected to the second signal terminal and a second location of the side wall corresponding to the second contact location. The first loop antenna is configured to wirelessly receive the first electronic signal. The first loop antenna is formed by the first electrically conductive element, the second electrically conductive element, a first portion of the side wall between the first electrically conductive element and the second electrically conductive element, and a first circumferential portion of the printed circuit board between the first electrically conductive element and the second electrically conductive element.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present technology will be apparent from the following detailed description of the embodiments and the accompanying drawing figures.

BRIEF DESCRIPTION OF THE DRAWING FIGURES

Embodiments of the present technology are described in detail below with reference to the attached drawing figures, wherein:

FIG. 1 is a front perspective view of a wrist-worn electronic device constructed in accordance with embodiments of the present technology, featuring a wrist band coupled to a housing which incorporates an improved antenna configuration;

FIG. 2 is a rear perspective view of the wrist-worn electronic device;

FIG. 9 is a top view of the side wall and the printed circuit illustrating at least a portion of the components that form a first antenna and a second antenna.

Figure 3:
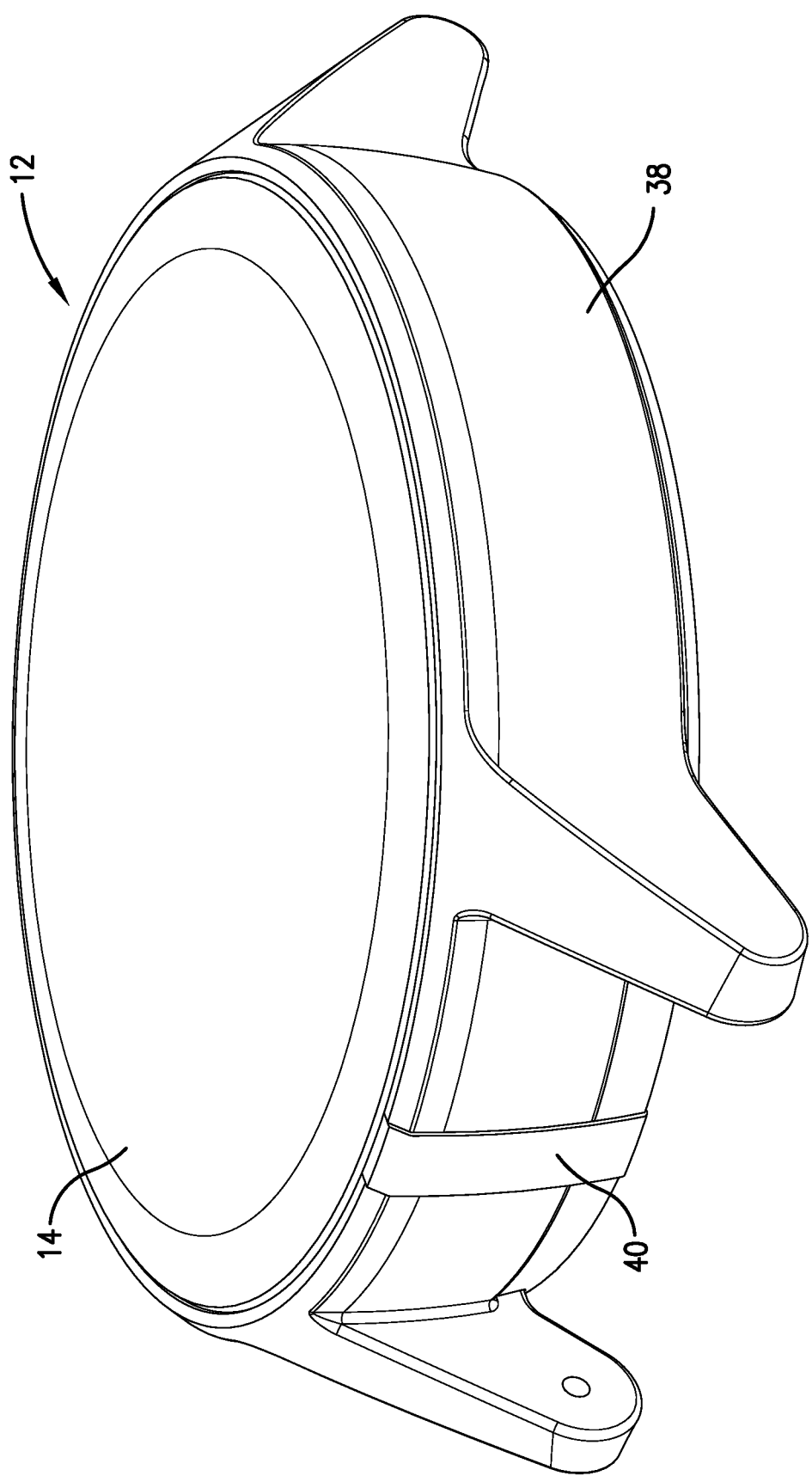
FIG. 3 is a perspective view of the wrist-worn electronic device without the wrist band, focusing on the housing and a display.

The drawing figures do not limit the present technology to the specific embodiments disclosed and described herein. While the drawings do not necessarily provide exact dimensions or tolerances for the illustrated components or structures, the drawings are to scale as examples of certain embodiments with respect to the relationships between the components of the structures illustrated in the drawings.

DETAILED DESCRIPTION

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the present technology. The following detailed description is, therefore, not to be taken in a limiting sense. The scope of the present technology is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Embodiments of the present technology relate to an electronic device that can be worn on a user's wrist and that communicates wirelessly with other devices, systems, and networks. The electronic device may be a fitness watch, a wrist-worn smart phone, a wrist-worn navigation device, or other wearable multi-function electronic devices that include a housing and a wrist band, strap, or other attachment mechanism. Although the electronic device is typically worn on a wrist, it may also be worn on other parts of a user's body such as the forearm or the upper arm. The electronic device may be used to monitor the user's current location, distance traveled, velocity, and other performance metrics by receiving location signals from a satellite-based positioning system including the global navigation satellite system (GNSS). The electronic device may be electronically paired with other devices such as a heart rate monitor worn around the user's chest, a foot pod attached to the user's shoe for measuring jogging or running cadence and distance, a bike speed and cadence sensor attached to a crank arm and wheel hub of the user's bicycle for tracking biking performance, and so forth. Furthermore, the electronic device may be able to communicate with smartphones, tablets, laptop or desktop computers, WiFi routers, cell towers, and the like to allow the user to upload activity data, download apps, download or stream music, receive text messages, emails, and weather alerts, and so on. Thus, the electronic device may utilize or process signals with GNSS protocols, Bluetooth™, WiFi, or cellular protocols, and so forth.

Typically, multiple communication protocols require multiple antennas within the housing of the device to transmit and receive wireless signals. However, positioning of the antennas within the confines of the housing such that the wireless signal from one antenna does not interfere with the wireless signals of the other antennas can be challenging.

Embodiments of the present technology provide a wrist-worn electronic device with an improved antenna configuration that utilizes a side wall of the housing to form at least a portion of multiple antennas. The device broadly comprises a housing with a side wall, a printed circuit board with a plurality of signal terminals, a plurality of electrically conductive elements which electrically connect to signal terminals on the printed circuit board to the side wall, a first antenna, and a second antenna. The first antenna is formed by a first electrically conductive element, a second electrically conductive element, a first portion of the side wall between the first electrically conductive element and the second electrically conductive element, and a first circumferential portion of the printed circuit board between the first electrically conductive element and the second electrically conductive element. The second antenna is formed by a third electrically conductive element, a fourth electrically conductive element, a second portion of the side wall between the third electrically conductive element and the fourth electrically conductive element, and a second circumferential portion of the printed circuit board between the third electrically conductive element and the fourth electrically conductive element.

Embodiments of the technology will now be described in more detail with reference to the drawing figures. Referring initially to FIGS. 1-8, an exemplary wrist-worn electronic device 10 is illustrated. The electronic device 10 broadly comprises a housing 12, a display 14, a user interface 16, a location determining element 18, a communication element 20, a memory element 22, a processing element 24, a printed circuit board 26, a plurality of electrically conductive elements 28, a first antenna 30, and a second antenna 32. The electronic device 10 may also include a wrist band 34, a strap, or other attachment mechanisms.

The housing 12, as shown in FIGS. 1-3, generally houses or retains other components of the electronic device 10 and may include or be coupled to the wrist band 34. The housing 12 may include a bottom wall 36, a side wall 38, an isolation portion 40, and an internal cavity 42. The bottom wall 36 includes a lower, outer surface that contacts the user's wrist while the user is wearing the electronic device 10. The bottom wall 36 is formed from electrically non-conductive material, such as polymers, plastics, rubber, glass, wood, and the like.

Figure 4:
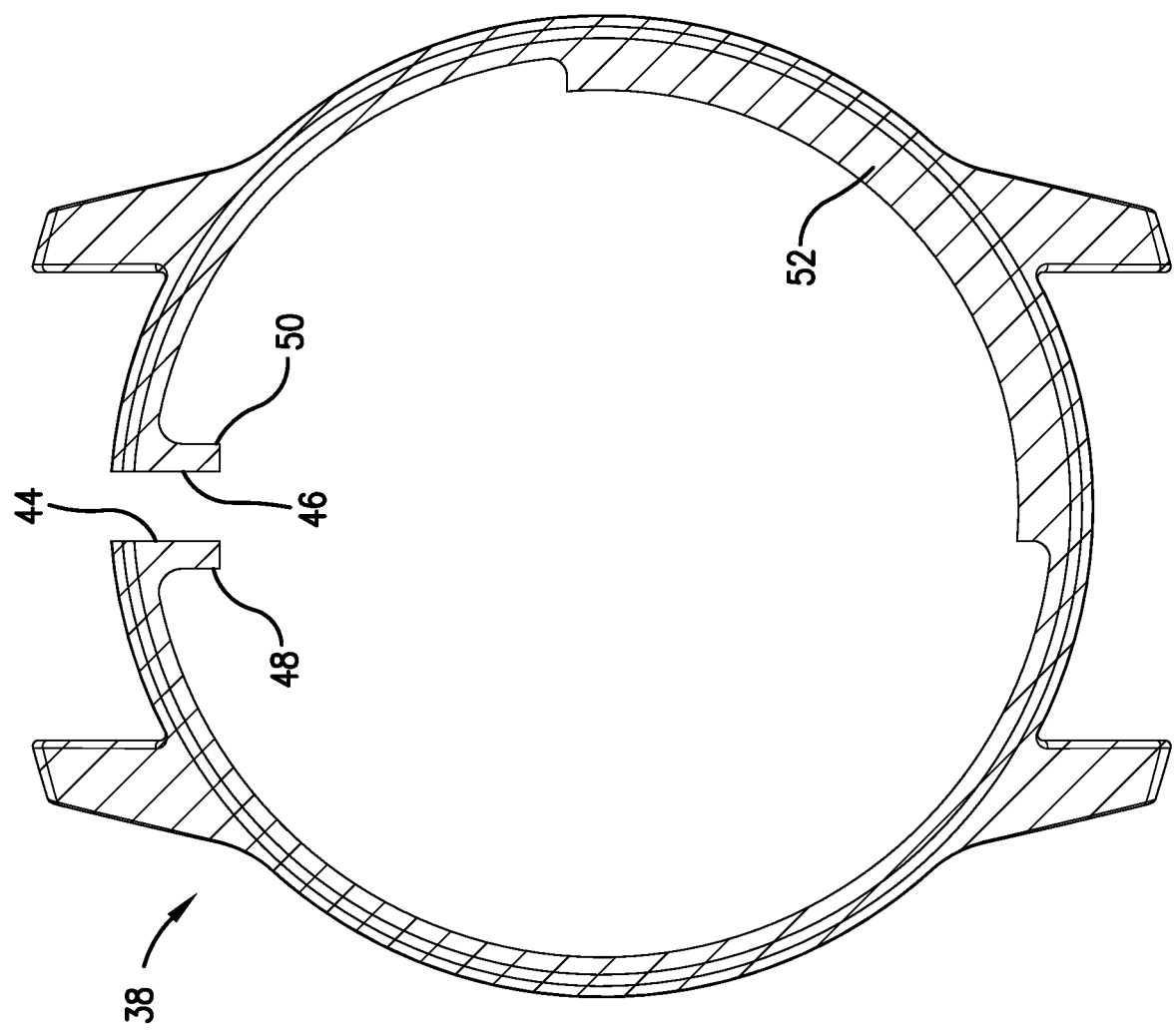
FIG. 4 is a top view of a side wall of the housing in isolation.

The side wall 38 couples to the bottom wall 36 at a lower edge of the side wall 38. An upper edge of the side wall 38 may couple to a lower surface of a display 14 or a bezel. The side wall 38 has a generally arcuate shape of a large angle that almost forms a circle or a ring, as shown in FIG. 4. For example, the side wall 38 may form an arcuate structure with an angle of approximately 340 degrees to approximately 350 degrees. The side wall 38 has an inner surface and an opposing outer surface.

In embodiments, the isolation portion 40 is positioned between a first end surface 44 and a second end surface 46, which are spaced apart to provide for positioning of the isolation portion 40 in the perimeter or circumference of the housing 12. The isolation portion 40 of the side wall 38 is formed from non-conductive material extending from an upper edge of the side wall 38 to a lower edge of the side wall 38. As a result, the non-conductive isolation portion may extend from the bottom wall 36 to the display 14 or a bezel positioned above the side wall 38. The isolation portion of the side wall 38 may be formed of a plastic or other non-conductive material that reduces electrical coupling or electrically isolates the first antenna 30 from the second antenna 32. For instance, the isolation portion of the side wall 38 may reduce electrical coupling between signal terminals and conductive elements associated with the first antenna 30 and the second antenna 32.

In addition, the side wall 38 may include a first tab 48, coupled to the inner surface adjacent to the first end surface 44 and extending inward, and a second tab 50, coupled to the inner surface adjacent to the second end surface 46 and extending inward. Furthermore, the side wall 38 may include an inner rim 52 coupled to the inner surface and extending inward. The inner rim 52 may extend along just a portion of the circumference of the inner surface. The circumferential length of the side wall 38 may be related to, or vary according to, one or more wavelengths, portions thereof, of one or more wireless signals to be transmitted and received by the antennas 30, 32, as discussed in more detail below.

In some embodiments, the entirety of the side wall 38 is formed from an electrically conductive material, such as a metal or metal alloy. In other embodiments, only an upper portion, such as an upper half, of the side wall 38, which is not coupled to the bottom wall 36, is formed from an electrically conductive material. A lower portion of the side wall 38, which is coupled to the bottom wall 36, may be formed from an electrically non-conductive material. Alternatively, the lower portion may be formed from a first electrically conductive material, while the upper portion is formed from a second electrically conductive material. In still other embodiments, the lower portion of the side wall 38 may be formed from a first electrically conductive material, while an upper portion of an inner surface of the side wall 38 is formed from a second electrically conductive material which may have improved or superior dielectric properties over the first electrically conductive material. Examples of the first electrically conductive material may include steel, nickel, aluminum, or alloys thereof. Examples of the second electrically conductive material may include gold, copper, or alloys there.

The isolation portion 40, as shown in FIGS. 1 and 3, may be formed from electrically non-conductive material, such as polymers, plastics, rubber, glass, wood, and the like. The isolation portion 40 has a generally arcuate shape of a small angle that has a value equal to 360 degrees minus the angle of the side wall 38. The isolation portion 40 is positioned in the area between the first end surface 44 and the second end surface 46 of the side wall 38 such that the combination of the side wall 38 and the isolation portion 40 forms a continuous circular perimeter of the housing 12. In other embodiments, the combination of the side wall 38 and the isolation portion 40 may have an oval or elliptical shape. In still other embodiments, the housing 12 may include additional side walls which, in combination, form one of a plurality of geometric or polygonal shapes, such as triangular, square or rectangular, hexagonal, octagonal, and so forth.

The bottom wall 36, the side wall 38, and the isolation portion 40 form at least a portion of the boundary of the internal cavity 42.

The display 14, as shown in FIGS. 1 and 3, generally presents the information mentioned above, such as time of day, current location, and the like. The display 14 may be implemented in one of the following technologies: light-emitting diode (LED), organic LED (OLED), Light Emitting Polymer (LEP) or Polymer LED (PLED), liquid crystal display (LCD), thin film transistor (TFT) LCD, LED side-lit or back-lit LCD, or the like, or combinations thereof. In exemplary embodiments that are shown in the figures, the display 14 has a round or circular shape. In general, the display 14 may possess a shape that corresponds to the shape formed by the side wall 38 of the housing 12. The outer edges or perimeter of the display 14 may couple to the side wall 38.

The user interface 16 generally allows the user to directly interact with the electronic device 10 and may include pushbuttons, rotating knobs, or the like. In exemplary embodiments of FIGS. 1 and 3, the display 14 may include a touch screen occupying the entire display 14, or a portion thereof, so that the display 14 functions as at least a portion of the user interface 16. The touch screen may allow the user to interact with the electronic device 10 by physically touching, swiping, or gesturing on areas of the display 14.

The location determining element 18 generally determines a current geolocation of the electronic device 10 and may receive and process radio frequency (RF) signals from a multi-constellation global navigation satellite system (GNSS) such as the global positioning system (GPS), the GLONASS system, the Galileo system, or the like. The location determining element 18 may include satellite navigation receivers, processors, controllers, other computing devices, or combinations thereof, and memory. The location determining element 18 may process a signal, referred to herein as an "location electronic signal", from one or more satellites that includes data from which geographic information such as the current geolocation is derived. The electronic location signal may have a carrier frequency in a frequency band, including the L1 band of the GPS constellation, centered at approximately 1575.42 megahertz (MHz). The electronic location signal is received from one of the antennas 30, 32, discussed in more detail below. The current geolocation may include coordinates, such as the latitude and longitude, of the current location of the electronic device 10. The location determining element 18 may communicate the current geolocation to the processing element 24, the memory element 22, or both.

Although embodiments of the location determining element 18 may include a satellite navigation receiver, it will be appreciated that other location-determining technology may be used. For example, cellular towers or any customized transmitting radio frequency towers can be used instead of satellites may be used to determine the location of the electronic device 10 by receiving data from at least three transmitting locations and then performing basic triangulation calculations to determine the relative position of the device with respect to the transmitting locations. With such a configuration, any standard geometric triangulation algorithm can be used to determine the location of the electronic device. The location determining element 18 may also include or be coupled with a pedometer, accelerometer, compass, or other dead-reckoning components which allow it to determine the location of the device 10. The location determining element 18 may determine the current geographic location through a communications network, such as by using Assisted GPS (A-GPS), or from another electronic device. The location determining element 18 may even receive location data directly from a user.

The communication element 20 generally allows communication with external systems or devices, other than GPS systems. The communication element 20 may include signal or data transmitting and receiving circuits, such as amplifiers, filters, mixers, oscillators, digital signal processors (DSPs), and the like. Various combinations of these circuits may form a transceiver, which transmits, receives, and processes signals such as the ones listed in the following discussion. The communication element 20 may establish communication wirelessly by utilizing radio frequency (RF) signals and/or data that comply with communication standards such as WiFi, Bluetooth™, or combinations thereof, which typically utilize carrier frequency bands around 2.4 gigahertz (GHz). In addition, the communication element 20 may utilize communication standards such as ANT, ANT+, Bluetooth™ low energy (BLE), the industrial, scientific, and medical (ISM) band at 2.4 GHz, or the like. The communication element 20 may be in communication with the processing element 24 and the memory element 22.

Figure 5:
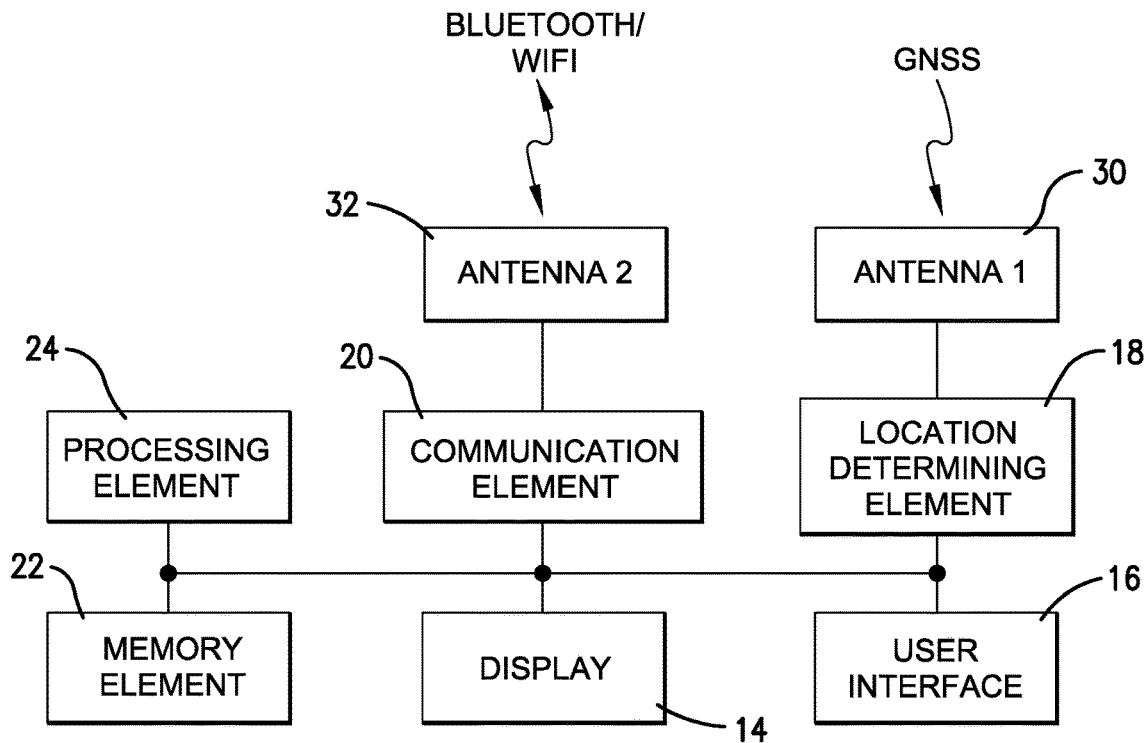
FIG. 5 is a schematic block diagram of a first embodiment of various electronic components of the wrist-worn electronic device.
Figure 6:
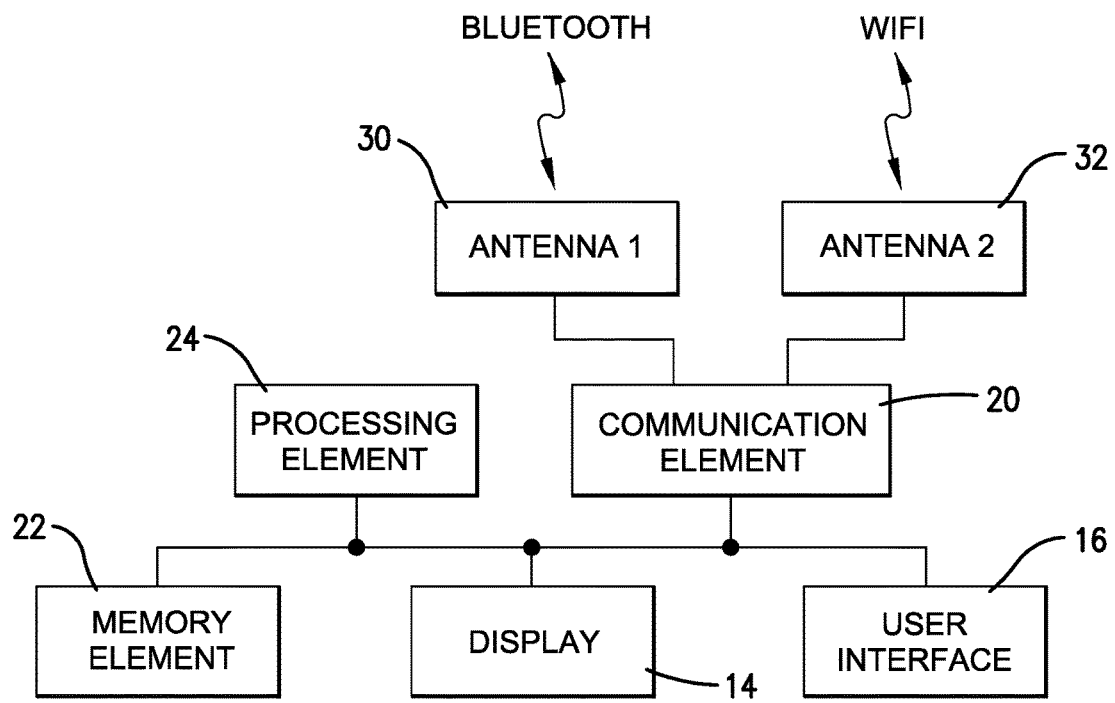
FIG. 6 is a schematic block diagram of a second embodiment of various electronic components of the wrist-worn electronic device.

In various embodiments, the electronic device 10 may be configured to establish communication using a plurality of communication protocols or standards, and the communication element 20 may include a transceiver for each protocol or standard, such as Bluetooth™, WiFi, etc., which the device 10 can communicate. For example, the electronic device 10 may utilize a first communication protocol, such as WiFi, to establish communication with an wireless access point such as a wireless router. The electronic device 10 may utilize a second communication protocol, such as Bluetooth™, to establish communication with exercise-related sensors, such as a foot pod, a bike speed and cadence sensor, or the like, or other electronic devices, such as a smartphone, a tablet, a laptop, or a desktop computer. In some embodiments as shown in FIG. 5, the communication element 20 may communicate a first communication electronic signal to the second antenna 32, wherein the first communication electronic signal includes either the first communication protocol, e.g., WiFi, or the second communication protocol, e.g., Bluetooth™ typically in a time division multiplexing fashion. In other embodiments as shown in FIG. 6, the communication element 20 may communicate the first communication electronic signal (including just the first communication protocol) to the first antenna 30 and a second communication electronic signal (including just the second communication protocol) to the second antenna 32.

The memory element 22 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 22 may be embedded in, or packaged in the same package as, the processing element 24. The memory element 22 may include, or may constitute, a "computer-readable medium". The memory element 22 may store the instructions, code, code statements, code segments, software, firmware, programs, applications, apps, services, daemons, or the like that are executed by the processing element 24. The memory element 22 may also store data that is received by the processing element 24 or the device in which the processing element 24 is implemented. The processing element 24 may further store data or intermediate results generated during processing, calculations, and/or computations as well as data or final results after processing, calculations, and/or computations. In addition, the memory element 22 may store settings, data, documents, sound files, photographs, movies, images, databases, and the like.

The processing element 24 may comprise one or more processors. The processing element 24 may include electronic hardware components such as microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 24 may generally execute, process, or run instructions, code, code segments, code statements, software, firmware, programs, applications, apps, processes, services, daemons, or the like. The processing element 24 may also include hardware components such as registers, finite-state machines, sequential and combinational logic, and other electronic circuits that can perform the functions necessary for the operation of the current invention. In certain embodiments, the processing element 24 may include multiple computational components and functional blocks that are packaged separately but function as a single unit. The processing element 24 may be in electronic communication with the other electronic components through serial or parallel links that include universal busses, address busses, data busses, control lines, and the like.

Figure 7:
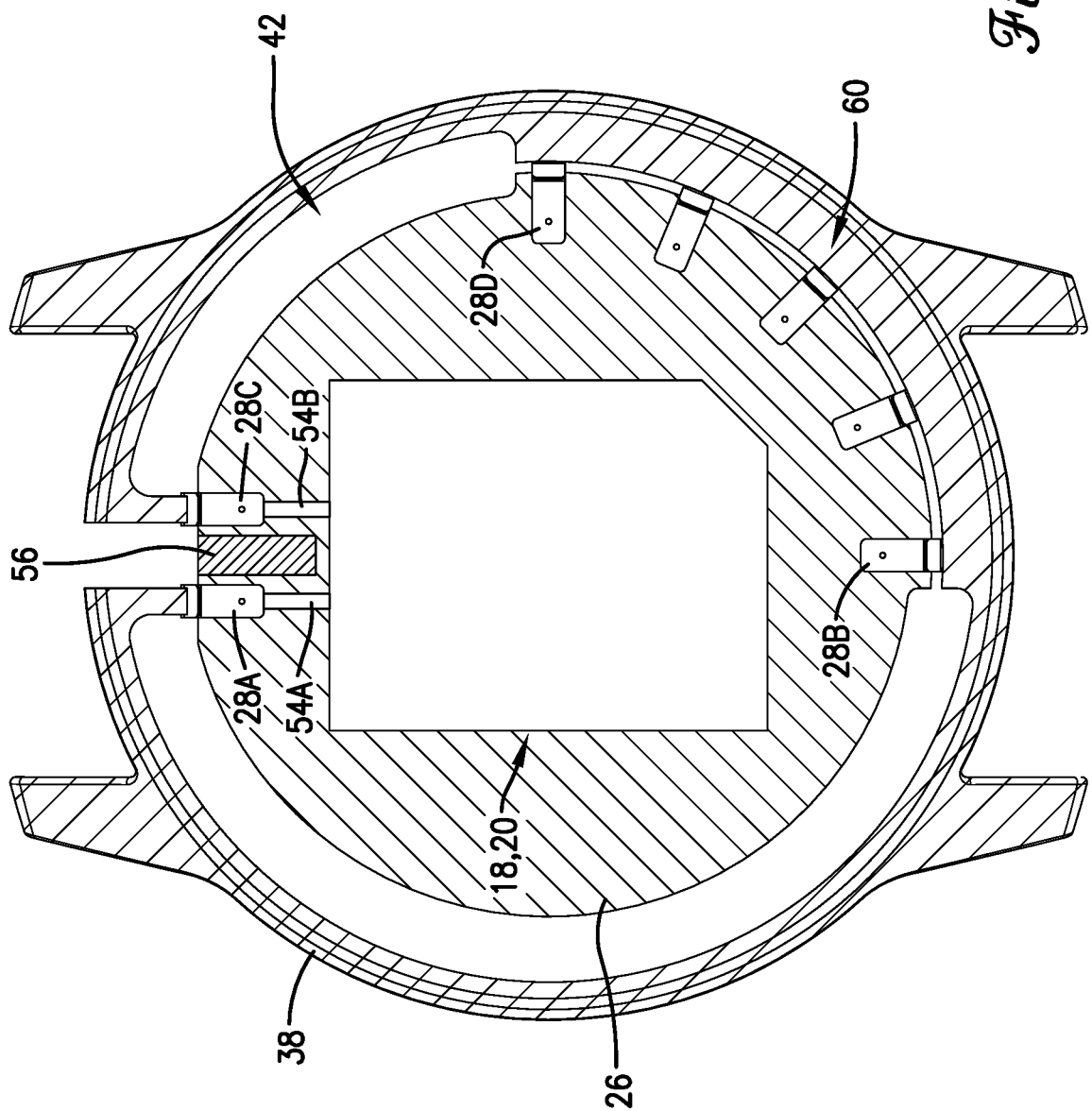
FIG. 7 is a top view of the side wall, a plurality of electrically conductive elements, and a printed circuit board including signal traces and a ground trace.
Figure 8:
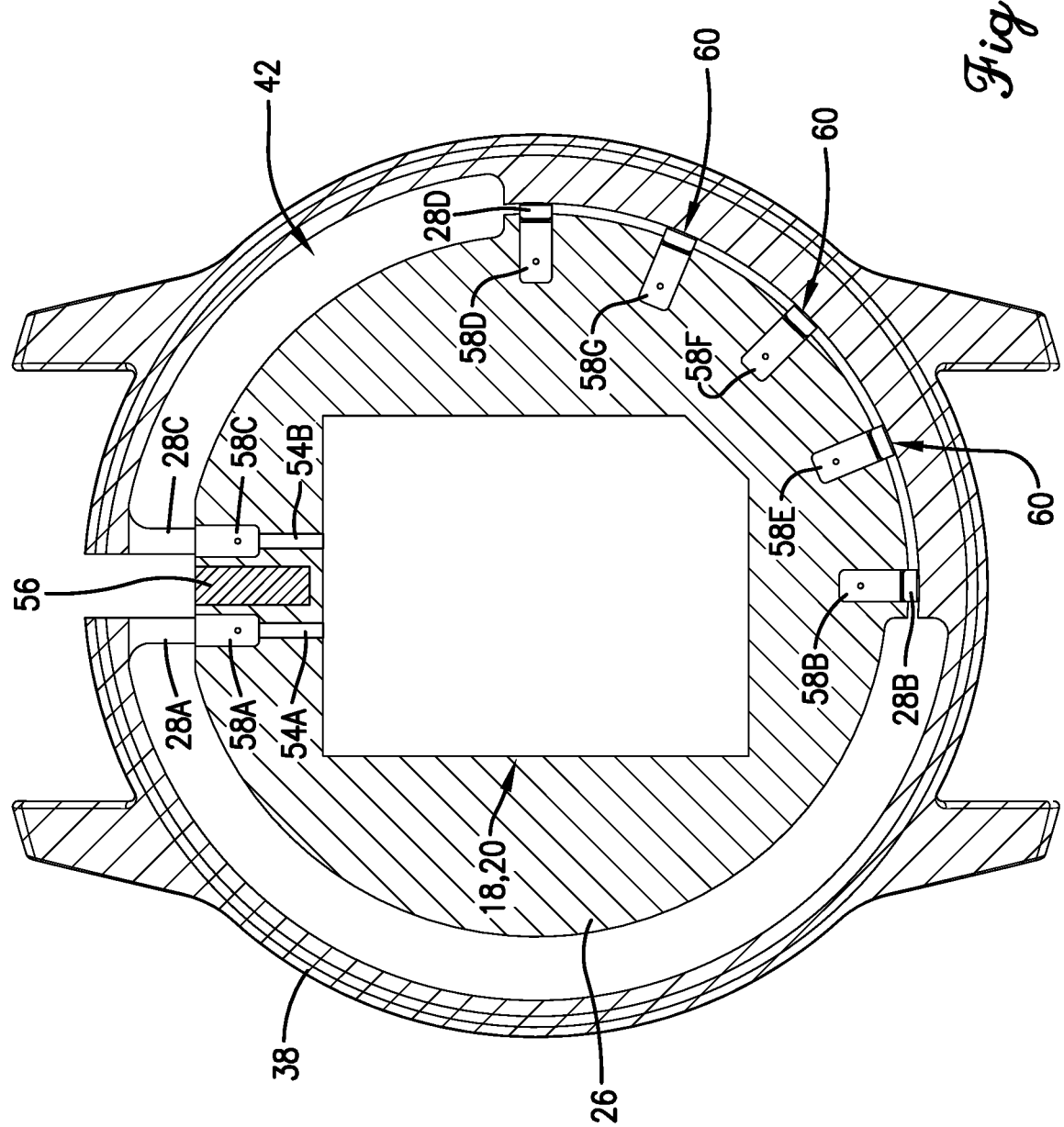
FIG. 8 is a top view of the side wall, a plurality of electrically conductive elements, and another embodiment of a printed circuit board including signal traces, a ground trace, and a plurality of signal terminals.

The printed circuit board 26, as shown in FIGS. 7-9, generally provides a substrate for supplying electric power to, and electronic communication between, the electronic components, such as the location determining element 18, the communication element 20, the memory element 22, and the processing element 24. The printed circuit board 26 may be constructed with a first, or top, surface and an opposing second, or bottom, surface. The printed circuit board 26 may also include multiple electrically conductive layers with a top conductive layer placed on the first surface, a bottom conductive layer placed on the second surface, one or more inner conductive layers positioned between the first and second surfaces, and an insulating layer between each pair of adjacent conductive layers. The insulating layers may be formed from rigidized material that includes various combinations of fiberglass, woven glass, matte glass, cotton paper, phenolic cotton paper, polyester, epoxies, epoxy resins, and the like. Each conductive layer may include one or more conductive electronic signal traces, electric power or ground traces, one or more signal, power, or ground pads, full or partial electric power planes, or full or partial electric ground planes. The conductive layers may be formed from metals typically including copper, but also including nickel, aluminum, gold, silver, palladium, zinc, tin, lead, and the like. In addition, the printed circuit board 26 may include plated through hole vias, blind vias, buried vias, and the like. The electronic components may be implemented in packages which are mounted, or retained, on the top surface, the bottom surface, or both surfaces. The electronic components may communicate with one another through electronic signal traces.

The printed circuit board 26 may be electrically isolated from the side wall 38 in at least along the perimeter of the printed circuit board 26 and side wall 38 corresponding to the first antenna 30 and second antenna 32. For instance, an air gap may exist or a non-conductive plastic may be positioned between the printed circuit board 26 and an inner surface of side wall 38 along a first circumferential portion of the printed circuit board 26 between the first conductive element 28A and the second conductive element 28B. Similarly, an air gap may exist or a non-conductive plastic may be positioned between the printed circuit board 26 and an inner surface of side wall 38 along second circumferential portion of the printed circuit board 26 between the third conductive element 28C and the fourth conductive element 28D.

The exemplary printed circuit board 26 shown in FIG. 7 includes at least two signal traces 54, and at least one reference ground strip 56. In other embodiments, as shown in FIG. 8, the printed circuit board 26 also includes a plurality of signal terminals 58. A first signal trace 54A may be positioned on the top surface of the printed circuit board 26 and provide electrical connection from one of the conductive elements 28 to an electronic component, such as the location determining element 18 or the communication element 20. A second signal trace 54B may be positioned on the top surface of the printed circuit board 26 and provide electrical connection from another one of the conductive elements 28 to an electronic component, such as the location determining element 18 or the communication element 20. The reference ground strip 56 provides electrical connection to electric ground and is positioned on the top surface between the first signal trace 54A and the second signal trace 54B, with a predetermined spacing between the reference ground strip 56 and the first signal trace 54A and between the reference ground strip 56 and the second signal trace 54B in order to form a strip-line architecture.

Each signal terminal 58 is formed from electrically conductive material and electrically connects to one of the signals traces 54 or electrical ground of the printed circuit board 26, such as ground planes or ground traces 56. Exemplary embodiments shown in FIG. 8 include a first signal terminal 58A positioned at a first contact location along the perimeter of the printed circuit board 26, a second signal terminal 58B positioned at a second contact location along the perimeter of the printed circuit board 26, a third signal terminal 58C positioned at a third contact location along the perimeter of the printed circuit board 26, and a fourth signal terminal 58D positioned at a fourth contact location along the perimeter of the printed circuit board 26. The first signal terminal 58A is electrically connected to the first signal trace 54A. The second signal terminal 58B is electrically connected to electrical ground. The third signal terminal 58C is electrically connected to the second signal trace 54B. The fourth signal terminal 58D is electrically connected to electrical ground. The printed circuit board 26 may also include fifth, sixth, and seventh signal terminals 58E, 58F, 58G positioned at fifth, sixth, and seventh contact locations, respectively, along the perimeter of the printed circuit board 26. The signal terminals 58E, 58F, 58G are electrically connected to electrical ground.

Each conductive element 28, as shown in FIGS. 7 and 8, may be formed from electrically conductive materials, such as metals and/or metal alloys. In exemplary embodiments shown in FIG. 7, each conductive element 28 may include a first connector section that electrically connects to signal traces 54 on the printed circuit board 26 and a second connector section that electrically connects to the first tab 48, the second tab 50, or the inner rim 52 or other portions of the side wall 38. In exemplary embodiments shown in FIG. 8, each conductive element 28 may include a first connector section that electrically connects from the side wall 38 to one of the signal terminals 58. Additionally or alternatively, the conductive elements 28 may include wires, jumpers, flexible conductors, pogo pins, clamp and/or spring structures, or the like, or combinations thereof that electrically connect or couple from the side wall 38 to a component such as a trace or terminal on the printed circuit board 26.

In one embodiment shown in FIG. 7, an exemplary electronic device 10 may include a first conductive element 28A electrically connecting the first signal trace 54A to a first point on the side wall 38 through the first tab 48, a second conductive element 28B electrically connecting electrical ground of the printed circuit board 26 to a second point on the side wall 38 through the inner rim 52, a third conductive element 28C electrically connecting the second signal trace 54B to a third point on the side wall 38 through the second tab 50, a fourth conductive element 28D electrically connecting electrical ground of the printed circuit board 26 to a fourth point on the side wall 38 through the inner rim 52, and a plurality of additional conductive elements 60 which electrically connect electrical ground (e.g., ground traces or ground planes) on the printed circuit board 26 to the side wall 38 through the inner rim 52. In embodiments of the electronic device 10 shown in the figures, the electronic device 10 includes three to five additional conductive elements 60, circumferentially spaced apart along the side wall 38.

In another embodiment shown in FIG. 8, the first conductive element 28A electrically connects the first point on the side wall 38 to the first signal terminal 58A. The second conductive element 28B electrically connects the second point on the side wall 38 to the second signal terminal 58B. The third conductive element 28C electrically connects the third point on the side wall 38 to the third signal terminal 58C. The fourth conductive element 28D electrically connects the fourth point on the side wall 38 to the fourth signal terminal 58D.

The reference ground strip 56 reduces electrical coupling or electrically isolates elements associated with the first antenna 30 from elements associated with the second antenna 32. For instance, the reference ground strip 56 reduces electrical coupling between the first signal trace 54A and the second signal trace 54B. Similarly, the reference ground strip 56 reduces electrical coupling between the first conductive element 28A and the third conductive element 28C. The reference ground strip 56 also reduces electrical coupling between the first signal terminal 58A and the second signal terminal 58C.

In various embodiments, the conductive elements 28 and the additional conductive elements 60 may electrically connect to an upper portion of the side wall 38 or to an upper portion of an inner surface of the side wall 38.

The first antenna 30 and the second antenna 32 are each typically configured or implemented as a loop antenna. Alternatively, each antenna 30, 32 may be configured or implemented as a slot antenna, a microstrip antenna, a patch antenna, a linear antenna, an inverted F-antenna, a dipole antenna, or the like. Each antenna 30, 32 is operable to convert wireless RF electromagnetic radiation (a wireless signal) into a corresponding electronic signal and to convert an electronic signal into a corresponding wireless signal. Each antenna 30, 32 also has a length that is proportional to, or that varies with, a wavelength, or a portion thereof, such as a quarter wavelength, of the wireless signal that it transmits and/or receives. In some embodiments as shown in FIG. 5, the first antenna 30 may be a location receiving antenna and the second antenna 32 may be a first communication protocol antenna. In other embodiments as shown in FIG. 6, the first antenna 30 may be a first communication protocol antenna and the second antenna 32 may be a second communication protocol antenna.

The location receiving antenna receives a wireless location signal from one or more GNSS constellation systems and communicates the corresponding location electronic signal to the location determining element 18. The first communication protocol antenna transmits and receives a first wireless RF signal associated with the first communication protocol. The first communication protocol antenna also communicates the first communication electronic signal associated with the first communication protocol to the communication element 20. If the electronic device 10 includes or utilizes two communication protocol antennas, then second communication protocol antenna transmits and receives a second wireless RF signal associated with the second communication protocol. The second communication protocol antenna also communicates the second communication electronic signal associated with the second communication protocol to the communication element 20.

Referring to FIG. 9, each antenna 30, 32 includes, or is formed by, two of the conductive elements 28, a portion of the perimeter of the side wall 38, and one of a plurality of return paths along a circumferential portion of the printed circuit board 26. The portions of side wall 38 and the printed circuit board 27 associated with the first antenna 30 are generally grouped and identified using a thick solid line in FIG. 9. Alternatively, the portions of side wall 38 and the printed circuit board 27 associated with the second antenna 32 are generally grouped and identified using a thick broken line in FIG. 9. An arrow illustrating the return path along a circumferential portion of the printed circuit board 26 is provided for each antenna 30, 32. It is to be understood that signals travel along the side wall 38 along a path opposing each return path such that the signals travel in a loop for each antenna 30, 32.

For example, the first antenna 30 includes, or is formed by, the first conductive element 28A, a first portion of the perimeter of the side wall 38, the second conductive element 28B, and a first return path along a first circumferential portion of the printed circuit board 26 between the first conductive element 28A and the second conductive element 28B. The first portion of the perimeter of the side wall 38 generally includes a length of the side wall 38 through an angle of approximately 180 degrees or a length in a counterclockwise direction from a position of approximately 12 o'clock to a position of approximately 6 o'clock. The first return path is positioned along the first circumferential portion of the printed circuit board 26 in alignment with the first portion of the perimeter of the side wall 38. The lengths of the first portion of the perimeter of the side wall 38 and the first return path are determined by, or vary according to, a wavelength, or a portion thereof, of the wireless signal that the first antenna 30 transmits and/or receives.

The second antenna 32 includes, or is formed by, the third conductive element 28C, a second portion of the perimeter of the side wall 38, the fourth conductive element 28D, and a second return path along a second circumferential portion of the printed circuit board 26 between the third conductive element 28C and the fourth conductive element 28D. The second portion of the perimeter of the side wall 38 generally includes a length of the side wall 38 through an angle of approximately 90 degrees or a length in a clockwise direction from a position of approximately 12 o'clock to a position of approximately 3 o'clock. The second return path is positioned along the second circumferential portion of the printed circuit board 26 in alignment with the second portion of the perimeter of the side wall 38. The lengths of the second portion of the perimeter of the side wall 38 and the second return path are determined by, or vary according to, a wavelength, or a portion thereof, of the wireless signal that the second antenna 32 transmits and/or receives.

The direction of flow of the electronic signals through each antenna 30, 32 is also indicated by the arrows shown in FIG. 9. For example, the electronic signal, such as the location electronic signal, that flows through the first antenna 30 flows from the location determining element 18 through the first conductive element 28A to the side wall 38 where it flows counterclockwise through the first portion of the perimeter of the side wall 38. The location electronic signal flows through the second conductive element 28B and then clockwise through the first return path along the first circumferential portion of the printed circuit board 26. The electronic signal, such as the first or second communication electronic signal, that flows through the second antenna 32 flows from the communication element 20 through the third conductive element 28C to the side wall 38 where it flows clockwise through the second portion of the perimeter of the side wall 38. The first or second communication electronic signal flows through the fourth conductive element 28D and then counterclockwise through the second return path along the second circumferential portion of the printed circuit board 26. Thus, the electronic signal flowing through the first antenna 30 flows in the opposite direction to the electronic signal flowing through the second antenna 32—thereby preventing, or at least reducing, signal coupling between the two electronic signals that may occur across the isolation portion 40 in the perimeter or circumference of the of the side wall 38. The isolation portion 40 may also be positioned at a location along the perimeter or circumference of the of the side wall 38 at which the paths of the two electronic signals are closest to one another.

In between the first portion of the perimeter and the second portion of the perimeter of the side wall 38 is a third portion of the perimeter which is electrically connected to electrical ground on the printed circuit board 26 through the additional conductive elements 60. Having the third portion of the perimeter of the side wall 38 electrically grounded reduces signal loss of the electronic signals flowing through the first antenna 30 (along the first portion of the perimeter) and the second antenna 32 (along the second portion of the perimeter).

The electronic device 10 may operate in one of a plurality of configurations or modes. In a first configuration or mode, the first antenna 30 may receive a GNSS satellite signal and communicate the corresponding location electronic signal, while the second antenna 32 may transmit and receive WiFi, Bluetooth™, or other protocol operating in the 2.4 GHz frequency band. The second antenna 32 may also communicate the first communication electronic signal. In some embodiments, the second antenna 32 may transmit and receive WiFi exclusively or Bluetooth™ exclusively. In other embodiments, the second antenna 32 may transmit and receive WiFi and Bluetooth™ in a time division multiplexing fashion.

In a second configuration or mode, the first antenna 30 may transmit and receive Bluetooth™ and communicate the corresponding first communication electronic signal, while the second antenna 32 may transmit and receive WiFi and communicate the corresponding second communication electronic signal.

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

What is claimed is:

1. A wrist-worn electronic device comprising:
a housing including a bottom wall formed from electrically non-conductive material and configured to contact a wearer's wrist, and a side wall coupled to the bottom wall, the side wall formed at least in part from a first electrically conductive material and including an isolation portion formed from non-conductive material extending from an upper edge of the side wall to a lower edge of the side wall;
a printed circuit board having a perimeter and retaining a first electrically conductive signal terminal positioned at a first contact location along the perimeter of the printed circuit board and a second electrically conductive signal terminal positioned at a second contact location along the perimeter of the printed circuit board;
a location determining element positioned on the printed circuit board and electrically coupled with the first signal terminal, the location determining element configured to receive a first electronic signal from the first signal terminal and determine a current geolocation of the electronic device based on the first electronic signal;
a first electrically conductive element electrically connected to the first signal terminal and a first location of the side wall corresponding to the first contact location;
a second electrically conductive element electrically connected to the second signal terminal and a second location of the side wall corresponding to the second contact location; and
a first loop antenna configured to wirelessly receive the first electronic signal and formed by the first electrically conductive element, the second electrically conductive element, a first portion of the side wall between the first electrically conductive element and the second electrically conductive element, and a first circumferential portion of the printed circuit board between the first electrically conductive element and the second electrically conductive element.

2. The wrist-worn electronic device of claim 1, wherein the printed circuit board is positioned within the housing and forms a ground plane for the first loop antenna, and wherein the first circumferential portion of the printed circuit board is substantially aligned with the first portion of the side wall.

3. The wrist-worn electronic device of claim 2, wherein the first signal terminal is electrically isolated from the side wall.

4. The wrist-worn electronic device of claim 1, wherein a length of the first loop antenna is equal to a one-half wavelength of the first electronic signal.

5. The wrist-worn electronic device of claim 1, wherein the side wall includes a lower portion positioned adjacent to the bottom wall and formed from electrically non-conductive material and an upper portion positioned away from the bottom wall and formed from the first electrically conductive material, and wherein the first and second electrically conductive elements are each electrically connected to the upper portion of the side wall.

6. The wrist-worn electronic device of claim 1, wherein the side wall includes an inner surface and an opposing outer surface, the inner surface including a lower portion positioned adjacent to the bottom wall and an upper portion positioned away from the bottom wall and formed of the first electrically conductive material, wherein the lower portion of the inner surface is formed from a second electrically conductive material of lower conductivity than the first electrically conductive material, and wherein the first and second electrically conductive elements are each electrically connected to the upper portion of the inner surface of the side wall.

7. The wrist-worn electronic device of claim 1, further comprising a communication element positioned on the printed circuit board,
wherein the printed circuit board further includes an electrically conductive third signal terminal positioned at a third contact location along the perimeter of the printed circuit board and an electrically conductive fourth signal terminal positioned at a fourth contact location along the perimeter of the printed circuit board,
wherein the wrist-worn electronic device further comprises:
a third electrically conductive element electrically connected to the third signal terminal and a third location of the side wall corresponding to the third contact location,
a fourth electrically conductive element electrically connected to the fourth signal terminal and a fourth location of the side wall corresponding to the fourth contact location, and
a second loop antenna configured to wirelessly transmit or receive a second electronic signal and formed by the third electrically conductive element, the fourth electrically conductive element, a second portion of the side wall between the third electrically conductive element and the fourth electrically conductive element, and a second circumferential portion of the printed circuit board between the third electrically conductive element and the fourth electrically conductive element;
wherein the communication element is electrically coupled with the third signal terminal and configured to communicate with another electronic device or a communication network.

8. The wrist-worn electronic device of claim 7, wherein the third signal terminal is electrically isolated from the side wall, and wherein the printed circuit board forms a ground plane for the second loop antenna.

9. The wrist-worn electronic device of claim 7, wherein the second circumferential portion of the printed circuit board is substantially aligned with the second portion of the side wall and includes a portion of an electrically conductive ground plane.

10. The wrist-worn electronic device of claim 7, wherein the isolation portion of the side wall reduces electrical coupling between the first loop antenna and the second loop antenna.

11. The wrist-worn electronic device of claim 7, wherein the isolation portion of the side wall reduces electrical coupling between the first signal terminal and the third signal terminal, the first signal terminal associated with the first loop antenna and the third signal terminal associated with the second loop antenna.

12. The wrist-worn electronic device of claim 7, further comprising a plurality of electrically conductive grounding elements, each grounding element electrically connected to an electrical ground of the printed circuit board and the side wall along a third portion of the side wall between the first portion and the second portion of the side wall.

13. The wrist-worn electronic device of claim 7, wherein the first electronic signal flows through the first loop antenna in a first direction around the circumference of the printed circuit board and the second electronic signal flows through the second loop antenna in a second direction around the circumference of the printed circuit board, the second direction opposite to the first direction.

14. The wrist-worn electronic device of claim 7, wherein a length of the second loop antenna is substantially equal to a one-half wavelength of the second electronic signal.

15. The wrist-worn electronic device of claim 7, wherein the printed circuit board includes a reference ground strip positioned at a location between the first signal terminal and the third signal terminal, the reference ground strip reducing electrical coupling between the first signal terminal and the third signal terminal.

16. A wrist-worn electronic device comprising:
a housing including a bottom wall formed from electrically non-conductive material and configured to contact a wearer's wrist, and a side wall coupled to the bottom wall, the side wall formed at least in part from an electrically conductive material and including an isolation portion formed from non-conductive material extending from an upper edge of the side wall to a lower edge of the side wall;
a printed circuit board positioned within the housing and having a perimeter corresponding to an inner surface of the side wall such that the printed circuit board is electrically isolated from the side wall, the printed circuit board retaining a first electrically conductive signal terminal positioned at a first contact location along the perimeter of the printed circuit board and a second electrically conductive signal terminal positioned at a second contact location along the perimeter of the printed circuit board;
a location determining element positioned on the printed circuit board and electrically coupled with the first signal terminal, the location determining element configured to receive a first electronic signal from the first signal terminal and determine a current geolocation of the electronic device based on the first electronic signal;
a first electrically conductive element electrically connected to the first signal terminal and the side wall at the first contact location;
a second electrically conductive element electrically connected to the second signal terminal and the side wall at the second contact location; and
a first loop antenna configured to wirelessly receive the first electronic signal and formed by the first electrically conductive element, the second electrically conductive element, a first portion of the side wall between the first electrically conductive element and the second electrically conductive element, and a first portion of the perimeter of the printed circuit board between the first electrically conductive element and the second electrically conductive element,
wherein the first circumferential portion of the printed circuit board is substantially aligned with the first portion of the side wall.

17. The wrist-worn electronic device of claim 16, further comprising a communication element positioned on the printed circuit board,
wherein the printed circuit board further includes an electrically conductive third signal terminal positioned at a third contact location along the perimeter of the printed circuit board and an electrically conductive fourth signal terminal positioned at a fourth contact location along the perimeter of the printed circuit board,
wherein the wrist-worn electronic device further comprises:
a third electrically conductive element electrically connected to the third signal terminal and a third location of the side wall corresponding to the third contact location,
a fourth electrically conductive element electrically connected to the fourth signal terminal and a fourth location of the side wall corresponding to the fourth contact location, and
a second loop antenna configured to wirelessly transmit or receive a second electronic signal and formed by the third electrically conductive element, the fourth electrically conductive element, a second portion of the side wall between the third electrically conductive element and the fourth electrically conductive element, and a second circumferential portion of the printed circuit board between the third electrically conductive element and the fourth electrically conductive element;
wherein the communication element is electrically coupled with the third signal terminal and configured to communicate with another electronic device or a communication network.

18. The wrist-worn electronic device of claim 17, wherein the second circumferential portion of the printed circuit board is substantially aligned with the second portion of the side wall.

19. The wrist-worn electronic device of claim 17, further comprising a plurality of electrically conductive grounding elements, each grounding element electrically connected to an electrical ground of the printed circuit board and the side wall along a third portion of the side wall between the first portion and the second portion of the side wall.

20. A wrist-worn electronic device comprising:
a housing including a bottom wall formed from electrically non-conductive material and configured to contact a wearer's wrist, and a side wall coupled to the bottom wall, the side wall formed at least in part from an electrically conductive material;
a printed circuit board having a perimeter corresponding to an inner surface of the side wall such that the printed circuit board is electrically isolated from the side wall, the printed circuit board retaining an electrically conductive first signal terminal positioned at a first contact location along the perimeter of the printed circuit board, a second electrically conductive signal terminal positioned at a second contact location along the perimeter of the printed circuit board, a third signal terminal positioned at a third contact location along the perimeter of the printed circuit board, and an electrically conductive fourth signal terminal positioned at a fourth contact location along the perimeter of the printed circuit board;

a location determining element positioned on the printed circuit board and electrically coupled with the first signal terminal, the location determining element configured to receive a location electronic signal from the first signal terminal and determine a current geolocation of the electronic device based on the first electronic signal;

a communication element positioned on the printed circuit board and coupled with the third signal terminal, the communication element configured to transmit and receive a communication electronic signal with the third signal terminal;

a first electrically conductive element electrically connected to the first signal terminal and the side wall at the first contact location;

a second electrically conductive element electrically connected to the second signal terminal and the side wall at the second contact location;

a third electrically conductive element electrically connected to the third signal terminal at the third contact location;

a fourth electrically conductive element electrically connected to the fourth signal terminal at the fourth contact location;

a first loop antenna formed by the first electrically conductive element, the second electrically conductive element, a first portion of a perimeter of the side wall between the first electrically conductive element and the second electrically conductive element, and a first portion of the perimeter of the printed circuit board between the first electrically conductive element and the second electrically conductive element; and a second loop antenna formed by the third electrically conductive element, the fourth electrically conductive element, a second portion of the perimeter of the side wall between the third electrically conductive element and the fourth electrically conductive element, and a second portion of the perimeter of the printed circuit board between the third electrically conductive element and the fourth electrically conductive element.

* * * * *